United States Patent
Watanabe et al.

(10) Patent No.: US 10,615,414 B2
(45) Date of Patent: Apr. 7, 2020

(54) LITHIUM NICKELATE-BASED POSITIVE ELECTRODE ACTIVE SUBSTANCE PARTICLES AND PROCESS FOR PRODUCING THE SAME, AND NON-AQUEOUS ELECTROLYTE SECONDARY BATTERY

(71) Applicant: TODA KOGYO CORP., Hiroshima-shi, Hiroshima-ken (JP)

(72) Inventors: Hiroyasu Watanabe, Battle Creek, MI (US); Xiang Sun, Battle Creek, MI (US)

(73) Assignee: TODA KOGYO CORP., Hiroshima (JP)

( * ) Notice: Subject to any disclaimer, the term of this patent is extended or adjusted under 35 U.S.C. 154(b) by 244 days.

(21) Appl. No.: 15/386,406

(22) Filed: Dec. 21, 2016

(65) Prior Publication Data
US 2017/0207455 A1    Jul. 20, 2017

Related U.S. Application Data
(63) Continuation-in-part of application No. 15/377,197, filed on Dec. 13, 2016, now abandoned.
(Continued)

(51) Int. Cl.
*H01M 4/36*  (2006.01)
*H01M 4/525*  (2010.01)
(Continued)

(52) U.S. Cl.
CPC .......... *H01M 4/525* (2013.01); *C23C 16/403* (2013.01); *C23C 16/45527* (2013.01);
(Continued)

(58) Field of Classification Search
CPC ...... H01M 4/525; H01M 4/366; H01M 4/483; H01M 10/0525; H01M 10/052;
(Continued)

(56) References Cited

U.S. PATENT DOCUMENTS

| | | |
|---|---|---|
| 5,264,201 A | 11/1993 | Dahn et al. |
| 2013/0330630 A1 | 12/2013 | Christensen et al. |

(Continued)

FOREIGN PATENT DOCUMENTS

| | | |
|---|---|---|
| EP | 2 581 343 | 4/2013 |
| JP | 10-302779 | 11/1998 |

(Continued)

OTHER PUBLICATIONS

Bettge et al. "Improving high capacity $Li_{1.2}Ni_{0.15}Mn_{0.55}Co_{0.1}O_2$-based lithium-ion cells by modifying the positive electrode with alumina" *Journal of Power Sources*, 223 2013 346-357.
(Continued)

*Primary Examiner* — Laura Weiner
(74) *Attorney, Agent, or Firm* — Nixon & Vanderhye P.C.

(57) ABSTRACT

The present invention provides lithium nickelate-based positive electrode active substance particles having a high energy density which are excellent in charge/discharge cycle characteristics when highly charged, and hardly suffer from generation of gases upon storage under high-temperature conditions, and a process for producing the positive electrode active substance particles, as well as a non-aqueous electrolyte secondary battery. The present invention relates to positive electrode active substance particles each comprising a core particle X comprising a lithium nickelate composite oxide having a layer structure which is represented by the formula: $Li_{1+a}Ni_{1-b-c}Co_bM_cO_2$ wherein M is at least one element selected from the group consisting of Mn, Al, B, Mg, Ti, Sn, Zn and Zr; a is a number of −0.1 to 0.2
(Continued)

($-0.1 \leq a \leq 0.2$); b is a number of 0.05 to 0.5 ($0.05 \leq b \leq 0.5$); and c is a number of 0.01 to 0.4 ($0.01 \leq c \leq 0.4$); a coating compound Y comprising at least one element selected from the group consisting of Al, Mg, Zr, Ti and Si; and a coating compound Z comprising an Li element, in which a content of lithium hydroxide LiOH in the positive electrode active substance particles is not more than 0.40% by weight, a content of lithium carbonate $Li_2CO_3$ in the positive electrode active substance particles is not more than 0.65% by weight, and a weight ratio of the content of lithium carbonate to the content of lithium hydroxide is not less than 1.

6 Claims, 4 Drawing Sheets

Related U.S. Application Data

(60) Provisional application No. 62/279,215, filed on Jan. 15, 2016.

(51) Int. Cl.
| | | |
|---|---|---|
| *C23C 16/455* | (2006.01) | |
| *C23C 16/40* | (2006.01) | |
| *C23C 16/56* | (2006.01) | |
| *H01M 4/48* | (2010.01) | |
| *H01M 10/0525* | (2010.01) | |
| *H01M 10/052* | (2010.01) | |
| *H01M 4/02* | (2006.01) | |

(52) U.S. Cl.
CPC .. *C23C 16/45531* (2013.01); *C23C 16/45553* (2013.01); *C23C 16/45555* (2013.01); *C23C 16/56* (2013.01); *H01M 4/366* (2013.01); *H01M 4/483* (2013.01); *H01M 10/0525* (2013.01); *H01M 10/052* (2013.01); *H01M 2004/021* (2013.01); *H01M 2004/028* (2013.01); *H01M 2220/30* (2013.01)

(58) Field of Classification Search
CPC ..... H01M 2004/028; H01M 2004/021; H01M 2220/30; C23C 16/403
See application file for complete search history.

(56) References Cited

U.S. PATENT DOCUMENTS

| | | | |
|---|---|---|---|
| 2015/0340689 A1 | 11/2015 | Song et al. | |
| 2016/0006031 A1 | 1/2016 | Kaseda et al. | |
| 2016/0380263 A1* | 12/2016 | Nakayama | H01M 4/525 |
| | | | 429/223 |

FOREIGN PATENT DOCUMENTS

| | | | |
|---|---|---|---|
| JP | 2004-335345 | | 11/2004 |
| WO | WO 2012/022618 | | 2/2012 |
| WO | WO 2012/022624 | | 2/2012 |
| WO | WO 2015/111740 | * | 7/2015 |
| WO | WO 2016/196445 | | 12/2016 |

OTHER PUBLICATIONS

International Search Report issued in PCT/IB2018/055199 dated Oct. 9, 2018.
Written Opinion of the International Searching Authority issued in PCT/IB2018/055199 dated Oct. 9, 2018.
Delmas et al., "An overview of the Li(Ni,M)$O_2$ systems: syntheses structures and properties," *Electrochimica Acta*, vol. 45: 243-253 1999.
Kim et al., "Washing Effect of a $LiNi_{0.83}Co_{0.15}Al_{0.02}O_2$ cathode in Water," *Electrochemical and Solid-State Letters*, vol. 9, No. 1: A19-A23 (2006).
Lee et al., "The role of nanoscale-range vanadium treatment in $LiNi_{0.8}Co_{0.15}Al_{0.05}O_2$ cathode materials for Li-ion batteries at elevated temperatures," *Journal of Materials Chemistry A*, vol. 3: 13453-13460 (2015).
International Preliminay Report on Patentability issued in PCT/US2017/013292 dated Jul. 17, 2018.
International Search Report issued in PCT/US2017/013292 dated Apr. 5, 2017.
Search Report issued in EP Appln. No. 17738987.1 dated Jul. 25, 2019.

* cited by examiner

● Covering Al, Mg, Zr, Ti, Si compound: Y

▨ Covering Li compound: Z

Lithium nickel dioxide

LITHIUM NICKELATE-BASED POSITIVE ELECTRODE ACTIVE SUBSTANCE PARTICLES AND PROCESS FOR PRODUCING THE SAME, AND NON-AQUEOUS ELECTROLYTE SECONDARY BATTERY

CROSS-REFERENCE TO RELATED APPLICATION

This application is a Continuation-in-Part of U.S. patent application Ser. No. 15/377,197 entitled "LI-NI COMPOSITE OXIDE PARTICLES AND PROCESS FOR PRODUCING THE SAME, AND NON-AQUEOUS ELECTROLYTE SECONDARY BATTERY" filed Dec. 13, 2016, and now abandoned, which claims the benefit of U.S. Provisional Patent Application Ser. No. 62/279,215 entitled "LI-NI COMPOSITE OXIDE PARTICLES AND PROCESS FOR PRODUCING THE SAME, AND NON-AQUEOUS ELECTROLYTE SECONDARY BATTERY" filed Jan. 15, 2016. These prior applications are incorporated by reference.

TECHNICAL FIELD

The present invention relates to lithium nickelate-based positive electrode (cathode) active substance particles that comprise a coating compound Y comprising at least one element selected from the group consisting of Al, Mg, Zr, Ti and Si and a coating compound Z comprising an Li element, and a process for producing the lithium nickelate-based positive electrode active substance particles. Also, the present invention relates to positive electrode active substance particles having extremely low contents of lithium hydroxide and lithium carbonate as impurity phases, and a process for producing the positive electrode active substance particles. Furthermore, the present invention relates to a non-aqueous electrolyte secondary battery with a high-energy density produced by using the aforementioned positive electrode active substance particles, which is excellent in repeated charge/discharge cycle characteristics at a high voltage and can be prevented from suffering from generation of gases upon storage under high-temperature conditions.

BACKGROUND ART

With the recent rapid progress for reduction in size and weight of electronic equipments such as mobile phones and personal computers, there is an increasing demand for secondary batteries having a high energy density as a power source for driving these electronic equipments. Under these circumstances, the batteries having a large charge/discharge capacity per unit weight and unit volume and high repeated charge/discharge cycle characteristics have been recently noticed.

Hitherto, as one of positive electrode active substance particles useful for high energy-type lithium ion secondary batteries, there is known lithium nickelate $LiNiO_2$ of a layer (rock salt type) structure having a 4 V-order voltage. The $LiNiO_2$ particles are inexpensive and excellent in output characteristics as compared to lithium cobaltate $LiCoO_2$ particles as generally used positive electrode active substance particles, and therefore have been mainly applied to a power source for power tools. In recent years, the $LiNiO_2$ particles also tend to be now applied to a driving power source for electric vehicles in view of their characteristics. However, the lithium ion secondary batteries using the aforementioned $LiNiO_2$ particles as active substance particles therefor have problems such as deterioration in repeated charge/discharge cycle characteristics at a high voltage and generation of gases from the batteries upon storage under high-temperature conditions owing to elution of constitutional ions other than $Li^+$ ion from the active substance particles or incompleteness of the reaction between raw material particles upon synthesis thereof. For these reasons, it has been demanded to further improve powder characteristics of the active substance particles.

It is well known in the art that in the $NiO_6$ octahedron constituting the lithium nickelate-based positive electrode active substance particles, the $Ni^{3+}$ ion is kept in a low spin state at room temperature, in other words a d-orbital electronic configuration of the $Ni^{3+}$ ion is represented by $t_{2g}^6 e_g^1$. Therefore, the conventional lithium nickelate-based positive electrode active substance particles have failed to have such a high stability. In addition, the $Ni^{2+}$ ion has an ionic radius close to $Li^+$ ion, and therefor tends to suffer from structural defects such as cation mixing upon synthesis of the positive electrode active substance. For this reason, it has been contemplated that the $Ni^{3+}$ ion in the conventional lithium nickelate-based positive electrode active substance particles is substituted with $Co^{3+}$ ion or $Al^{3+}$ ion to improve characteristic thereof (Non-Patent Literature 1).

On the other hand, even the lithium nickelate composite oxide particles whose $Ni^{3+}$ ion is substituted with ions of different kinds of elements still comprise a more than necessary amount of lithium carbonate or lithium hydroxide as an impurity phase. These unreacted lithium compounds are main factors causing increase in a powder pH value of the lithium nickelate composite oxide particles, and tend to induce not only gelation of an electrode slurry upon production of the electrode slurry, but also generation of gases from the batteries upon storage under high-temperature conditions when the resulting secondary battery is subjected to charging and discharging cycles. In particular, in order to avoid remarkable adverse influence of the lithium hydroxide, the unreacted substance being present on a surface of the respective particles is carbonated (Patent Literatures 1 and 2), or removed by washing with water and drying (Non-Patent Literature 2).

In order to further improve the lithium nickelate composite oxide particles, there has been proposed the method of subjecting the particles as core particles to surface treatment in which the unreacted lithium carbonate or lithium hydroxide is converted into the other lithium compound. The coating film obtained by the surface treatment acts as a protective film against hydrofluoric acid produced by charging and discharging cycles of the resulting battery to prolong a service life of the battery (Non-Patent Literature 3).

CITATION LIST

Non-Patent Literature

Non-Patent Literature 1: C. Delmas, et al., "Electrochimica Acta", Vol. 45, 1999, pp. 243-253
Non-Patent Literature 2: J. Kim, et al., "Electrochem. and Solid-State Lett.", Vol. 9, 2006, pp. A19-A23
Non-Patent Literature 3: M.-J. Lee, et al., "J. Mater. Chem. A", Vol. 3, 2015, pp. 13453-13460

Patent Literature

Patent Literature 1: Japanese Patent Application Laid-open (KOKAI) No. 10-302779
Patent Literature 2: Japanese Patent Application Laid-open (KOKAI) No. 2004-335345

SUMMARY OF INVENTION

Technical Problem

At present, it has been strongly required to provide positive electrode active substance particles for a secondary battery comprising a lithium nickelate composite oxide, which are excellent in repeated charge/discharge cycle characteristics at a high voltage and can be prevented from suffering from generation of gases upon storage under high-temperature conditions. However, the positive electrode active substance particles capable of satisfying these requirements to a sufficient extent have not been obtained yet.

That is, in the technologies described in the Non-Patent Literatures 1 and 2 as well as the Patent Literatures 1 and 2, although the contents of lithium hydroxide and/or lithium carbonate in the positive electrode active substance particles can be reduced, the particles are brought into direct contact with an electrolyte solution. Therefore, these technologies have failed to suppress occurrence of side reactions at an interface between the positive electrode active substance and the electrolyte solution, and have also failed to improve repeated charge/discharge cycle characteristics of the secondary battery and fully to suppress generation of gasses upon storage under high-temperature conditions. In addition, the cost required for water-washing and drying of the lithium nickelate composite oxide particles is comparatively high, and the technologies described in these conventional arts have failed to provide methods suitable for mass-production thereof.

The technology described in the Non-Patent Literature 3 relates to the method of subjecting the lithium nickelate composite oxide particles to surface treatment with vanadium by sol-gel method. However, owing to poor safety of vanadium and expensive sol-gel production method, the surface treatment method has failed to provide a method suitable for mass-production of the positive electrode active substance particles. In addition, the surface coating film obtained by the method has a thickness of 17 nm which is excessive to merely suppress occurrence of side reactions at an interface between the positive electrode active substance and the electrolyte solution.

In consequence, an object or technical task of the present invention is to provide lithium nickelate-based positive electrode active substance particles that comprise a coating compound Y comprising at least one element selected from the group consisting of Al, Mg, Zr, Ti and Si and a coating compound Z comprising an Li element, and a process for producing the lithium nickelate-based positive electrode active substance particles. Another object or technical task of the present invention is to provide positive electrode active substance particles having extremely low contents of lithium hydroxide and lithium carbonate, and a process for producing the positive electrode active substance particles. A further object or technical task of the present invention is to provide a non-aqueous electrolyte secondary battery with a high-energy density produced by using the aforementioned positive electrode active substance particles, which is excellent in repeated charge/discharge cycle characteristics at a high voltage and can be prevented from suffering from generation of gases upon storage under high-temperature conditions.

Solution to Problem

The above object or technical task can be achieved by the following aspects of the present invention.

That is, according to the present invention, there are provided positive electrode active substance particles each comprising:

a core particle X comprising a lithium nickelate composite oxide having a layer structure which is represented by the formula:

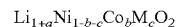

$$Li_{1+a}Ni_{1-b-c}Co_bM_cO_2$$

wherein M is at least one element selected from the group consisting of Mn, Al, B, Mg, Ti, Sn, Zn and Zr; a is a number of −0.1 to 0.2 (−0.1≤a≤0.2); b is a number of 0.05 to 0.5 (0.05≤b≤0.5); and c is a number of 0.01 to 0.4 (0.01≤c≤0.4);

a coating compound Y comprising at least one element selected from the group consisting of Al, Mg, Zr, Ti and Si; and a coating compound Z comprising an Li element, in which a content of lithium hydroxide LiOH in the positive electrode active substance particles is not more than 0.40% by weight, a content of lithium carbonate $Li_2CO_3$ in the positive electrode active substance particles is not more than 0.65% by weight, and a weight ratio of the content of lithium carbonate to the content of lithium hydroxide is not less than 1 (Invention 1).

Also, according to the present invention, there are provided the positive electrode active substance particles as defined in the above Invention 1, wherein a weight ratio of the coating compound Z to the coating compound Y is in the range of 1 to 100 (Invention 2).

Also, according to the present invention, there are provided the positive electrode active substance particles as defined in the above Invention 1, wherein the positive electrode active substance particles have a BET specific surface area of 0.05 to 0.70 m²/g, a median diameter $D_{50}$ of aggregated particles of 1 to 30 μm, and a 2% powder pH value of not more than 11.40 (Invention 3).

In addition, according to the present invention, there is provided a process for producing the positive electrode active substance particles as defined in the above Invention 1, comprising the steps of:

forming the coating compound Y on a surface of the core particle X by a vapor phase epitaxy method; and then subjecting the resulting particle to humidification treatment and heat treatment in atmospheric air at a temperature of 150 to 450° C. to form the coating compound Z on the particle (Invention 4).

Further, according to the present invention, there is provided a process for producing the positive electrode active substance particles as defined in the above Invention 1, comprising the steps of:

subjecting the core particle X to humidification treatment and heat treatment in atmospheric air at a temperature of 150 to 450° C. to form the coating compound Z on a surface of the core particle X; and then forming the coating compound Y on the resulting particle by a vapor phase epitaxy method (Invention 5).

Furthermore, according to the present invention, there is provided a non-aqueous electrolyte secondary battery comprising a positive electrode active substance at least partially comprising the positive electrode active substance particles as defined in the above Invention 1 (Invention 6).

Advantageous Effects of Invention

The lithium nickelate-based positive electrode active substance particles according to the present invention comprise a coating compound Y comprising at least one element selected from the group consisting of Al, Mg, Zr, Ti and Si, and a coating compound Z comprising Li. Therefore, direct contact between an electrolyte solution and the lithium nickelate-based positive electrode active substance particles can be inhibited, and occurrence of side reaction therebetween can be suppressed. For these reasons, the lithium nickelate-based positive electrode active substance particles according to the present invention can be suitably used as positive electrode active substance particles for a non-aqueous electrolyte secondary battery which are excellent in repeated charge/discharge cycle characteristics at a high voltage. In addition, in the positive electrode active substance particles according to the present invention, the contents of lithium hydroxide and lithium carbonate therein are reduced, gelation of an electrode slurry upon preparation thereof can be inhibited, and generation of gases upon storage under high-temperature conditions can be suppressed. In consequence, the positive electrode active substance particles according to the present invention can be suitably used for a non-aqueous electrolyte secondary battery having a long service life a high safety and a high energy density.

Also, the process for producing the lithium nickelate-based positive electrode active substance particles according to the present invention is characterized by including the steps of forming the coating compound Y by a vapor phase epitaxy method and forming the coating compound Z by subjecting the particles to humidification treatment followed by heat treatment. Thus, the processes according to the present invention are suitable for mass-production thereof. This is because the process does not contain the conventional surface treatment technologies that the positive electrode active substance particles of the lithium nickelate composite oxide were washed during adequately controlling a pH value of the particles, filtrated, dried, and clacined under a high-concentration oxygen gas atmosphere.

DESCRIPTION OF EMBODIMENTS

Figure 1:
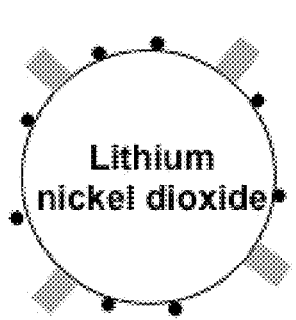
FIG. 1 is a schematic view showing lithium nickelate-based positive electrode active substance particles obtained according to the present invention.

The construction of the present invention is described in more detail below.

First, the lithium nickelate-based positive electrode active substance particles according to the present invention are described.

The lithium nickelate $LiNiO_2$ according to the present invention has a layer (rock salt) structure formed of a trigonal system having a space group of R3-m wherein the line "-" in the symbol of the space group means such a mark as generally expressed by a macron which should be laid on "3", but conveniently positioned after "3" herein. In addition, the lithium nickelate composite oxide having the same crystal structure as that of the lithium nickelate according to the present invention comprises a mother body constituted of the lithium nickelate, and is represented by the chemical formula:

$$Li_{1+a}Ni_{1-b-c}Co_bM_cO_2$$

wherein M is at least one element selected from the group consisting of Mn, Al, B, Mg, Ti, Sn, Zn and Zr; a is a number of −0.1 to 0.2 (−0.1≤a≤0.2); b is a number of 0.05 to 0.5 (0.05≤b≤0.5); and c is a number of 0.01 to 0.4 (0.01≤c≤0.4).

The lithium nickelate-based positive electrode active substance particles according to the present invention comprise the core particle X represented by the above chemical formula, the coating compound Y comprising at least one element selected from the group consisting of Al, Mg, Zr, Ti and Si, and the coating compound Z comprising an Li element. Furthermore, the positive electrode active substance particles according to the present invention are characterized in that the content of lithium hydroxide LiOH in the positive electrode active substance particles is not more than 0.40% by weight, the content of lithium carbonate $Li_2CO_3$ in the positive electrode active substance particles is not more than 0.65% by weight, and the weight ratio of the content of lithium carbonate to the content of lithium hydroxide is not less than 1. When the content of lithium hydroxide in the positive electrode active substance particles is more than 0.40% by weight, it may be difficult to obtain a coating material upon preparation of an electrode slurry. When the content of lithium carbonate in the positive electrode active substance particles is more than 0.65% by weight, the resulting secondary battery tends to be deteriorated in charge/discharge cycle characteristics. In addition, when the content of lithium carbonate in the positive electrode active substance particles is lower than the content of lithium hydroxide therein, it may be difficult to suppress generation of gassed from the resulting secondary battery.

In the lithium nickelate-based positive electrode active substance particles according to the present invention, the content of lithium hydroxide LiOH therein is preferably not more than 0.30% by weight, the content of lithium carbonate $Li_2CO_3$ therein is preferably not more than 0.50% by weight, and the weight ratio of the content of lithium carbonate to the content of lithium hydroxide is preferably not less than 1.7. The lithium hydroxide or the lithium carbonate may be a part of the aforementioned coating compound Z comprising an Li element. Also, it is estimated that the coating compound Z comprising an Li element is present in the form of an oxide, a carbonate or a hydroxide.

In the lithium nickelate-based positive electrode active substance particles according to the present invention, it is estimated that the coating compound Y comprising at least one element selected from the group consisting of Al, Mg, Zr, Ti and Si is present in the form of an oxide, a carbonate or a hydroxide.

The coating compound Y and the coating compound Z may be present in the form of either an island-shaped coat covering a part of the surface of the core particle or an overcoat covering a whole part of the surface of the core particle. In addition, the coating compound Y and the coating compound Z may also be in the form of a thin film-like coat. Furthermore, the coating compound Z may be present over the coating compound Y, whereas to the contrary, the coating compound Y may be present over the coating compound Z.

The BET specific surface area of the lithium nickelate-based positive electrode active substance particles according to the present invention is preferably 0.05 to 0.70 $m^2/g$. When the BET specific surface area of the lithium nickelate-based positive electrode active substance particles is less than 0.05 $m^2/g$, the amount of coarse particles included in the resulting particles tends to be increased. On the other hand, when the BET specific surface area of the lithium nickelate-based positive electrode active substance particles is more than 0.70 $m^2/g$, the resulting particles tend to be bulky particles. In the case where the BET specific surface area of the lithium nickelate-based particles is either less than 0.05 $m^2/g$ or more than 0.70 $m^2/g$, the resulting particles tend to become unsuitable as positive electrode active substance particles. The BET specific surface area of the lithium nickelate-based positive electrode active substance particles according to the present invention is more preferably 0.1 to 0.40 $m^2/g$.

The median diameter $D_{50}$ of aggregated particles of the lithium nickelate-based positive electrode active substance particles according to the present invention is preferably 1 to 30 μm. When the median diameter $D_{50}$ of aggregated particles of the lithium nickelate-based positive electrode active substance particles is less than 1 μm, the resulting particles tend to be bulky particles. On the other hand, when the median diameter $D_{50}$ of aggregated particles of the lithium nickelate-based positive electrode active substance particles is more than 30 μm, the amount of coarse particles included in the resulting particles tends to be increased. In the case where the median diameter $D_{50}$ of aggregated particles of the lithium nickelate-based particles is either less than 1 μm or more than 30 μm, the resulting particles tend to become unsuitable as positive electrode active substance particles. The median diameter $D_{50}$ of aggregated particles of the lithium nickelate-based positive electrode active substance particles according to the present invention is more preferably 2 to 25 μm.

The 2% pH value of the lithium nickelate-based positive electrode active substance particles according to the present invention is preferably not more than 11.40 from the standpoint of avoiding gelation of an electrode slurry. The 2% pH value of the lithium nickelate-based positive electrode active substance particles according to the present invention is more preferably not more than 11.30.

Next, the method for producing the core particle X constituted of the lithium nickelate composite oxide which is used in the lithium nickelate-based positive electrode active substance particles according to the present invention is described.

In the method for producing the core particle X constituted of the lithium nickelate composite oxide used in the present invention, nickel hydroxide particles are used as a precursor of the core particle X. The nickel element in the nickel hydroxide particles may be substituted with a cobalt element or the other element M (such as Mn, Al, B, Mg, Ti, Sn, Zn and Zr). The method for producing the aforementioned precursor is not particularly limited. However, the precursor is preferably produced by a crystallization method using an ammonia complex in a wet reaction. The precursor is mixed with a lithium raw material and additives as desired, and the resulting mixture is calcined. The lithium raw material used above is not particularly limited, and lithium carbonate, lithium hydroxide and lithium hydroxide monohydrate may be used as the lithium raw material.

The core particle X constituted of the lithium nickelate composite oxide according to the present invention may be produced by a solid state reaction method as the aforementioned procedure in which the mixture of the precursor and the respective raw materials is calcined. The solid state reaction is such a method in which the raw materials comprising respective elements constituting the target particles as aimed are mixed with each other, and the resulting mixture is subjected to high-temperature heat treatment to promote a chemical reaction between the solid raw materials. In order to facilitate diffusion of lithium in the precursor during the solid state reaction, it is desired that the particle diameter of the lithium raw material is very small and fine. It is also desired that the precursor and the raw materials are mixed by a drying method using no solvent. As the apparatus used for mixing the raw material particles, there may be used an attritor, a ball mill, a Henschel mixer, a high-speed mixer, etc.

It is well known in the art that upon synthesis of lithium nickelate by a solid state reaction, a part of nickel is converted into $Ni^{2+}$ ion when calcined at an elevated temperature and substituted for $Li^+$ ion in a crystal thereof, so that structural defects of the crystal are caused, which results in deterioration in battery characteristics. In addition, it is also known that NiO is produced when calcined at a still higher temperature (refer to H. Arai, et al., "Solid State Ionics", Vol. 80, 1995, pp. 261-269).

The method for producing the core particle X constituted of the lithium nickelate composite oxide according to the present invention is characterized in that the aforementioned mixture is calcined in the temperature range of 600 to 930° C. When the calcining temperature is lower than 600° C., the solid state reaction tends to hardly proceed sufficiently, so that it may be impossible to obtain desired lithium nickelate composite oxide particles. When the calcining temperature is higher than 930° C., the amount of the $Ni^{2+}$ ion intruded as structural defects into lithium sites tends to be increased, so that NiO having a rock salt structure as an impurity phase tends to be grown. The calcining temperature is preferably 700 to 900° C.

The core particle X constituted of the lithium nickelate composite oxide according to the present invention is preferably produced by calcination in a high-oxygen concentration atmosphere in order to reduce the content of the $Ni^{2+}$ ion therein. The retention time of the aforementioned calcining temperature is about 5 to about 15 hr, and the temperature rise rate or temperature drop rate in the calcination is about 50 to about 200° C./hr. As the calcination furnace, there may be used a gas-flow box-type muffle furnace, a gas-flow rotary furnace, a roller hearth kiln, etc.

The method for producing the coating compound Y, which is to be formed on the core particle X constituted of the lithium nickelate composite oxide according to the present invention, comprising at least one element selected from the group consisting of Al, Mg, Zr, Ti and Si is described.

The coating compound Y according to the present invention is preferably produced by a vapor phase epitaxy method. Examples of the vapor phase epitaxy method include a chemical vapor deposition (CVD) method, a physical vapor deposition (PVD) method and an atomic layer deposition (ALD) method. The atomic layer deposition method is one of the more preferred vapor phase epitaxy methods used in the present invention, in which atomic layers are formed one by one (about 1 Å for each), i.e., the method in which atoms are deposited in the form of a layer or a granule by repeating the following four steps: 1) supply of a raw material gas A to a material to be treated, i.e., reaction of the raw material gas A on a surface of the material to be treated; 2) evacuation of the raw material gas A; 3) supply of a raw material gas B that is further reacted on the surface of the material to be treated; and 4) evacuation of the raw material gas B, wherein the raw material gas A and the raw material gas B are necessarily different in composition from each other (X. Meng, et al., "Adv. Mater.", Vol. 24, 2012, pp. 3589-3615).

Examples of the preferred combination of the raw material gas A and the raw material gas B used in the atomic layer deposition method for producing the coating compound Y according to the present invention are as follows:

Raw Material Gas A/Raw Material Gas B:

$Al_2$ $(CH_3)_6/H_2O$; $Mg(C_2H_5)_2/H_2O$; $ZrCl_4/H_2O$; $TiCl_4/H_2O$; $SiCl_4/H_2O$; etc.

It is estimated that the atomic layer deposition method is capable of producing an oxide, a carbonate or a hydroxide from these raw material gases.

In the atomic layer deposition method for producing the coating compound Y according to the present invention, the number of repeated operations of the method including the steps 1) to 4) is 1 to 100 (times), preferably 2 to 50 and more preferably 2 to 10.

In the atomic layer deposition method for producing the coating compound Y according to the present invention, the temperature used for conducting the steps 1) to 4) may be optional within the range of 10 to 250° C.

The coating compound Y according to the present invention is produced by a vapor phase epitaxy method, and therefore may be occasionally present in the form of a very thin film having a thickness of several nm. Examples of particle surface analysis methods used for identifying the structure of the coating compound Y include observation using a high-resolution transmission electron microscope, elemental analysis in a depth direction by time-of-flight type secondary ion mass spectrometry, elemental analysis in a depth direction by X-ray photoelectron spectroscopy, etc. In addition, there may also be used the method of estimating the structure of the coating compound Y on the basis of concentrations of elements eluted when subjecting the coating compound solely to chemical etching in a solvent.

The method for producing the coating compound Z comprising an Li element which is to be formed on the core particle X constituted of the lithium nickelate composite oxide according to the present invention is described.

The method for forming the coating compound Z according to the present invention is such a technology in which lithium hydroxide LiOH that remains in the core particle X constituted of the lithium nickelate composite oxide is efficiently converted into lithium carbonate $Li_2CO_3$, and is therefore different from the conventional technologies. More specifically, the method for forming the coating compound Z according to the present invention is characterized in that by subjecting the core particle to adequate humidification treatment, the remaining lithium hydroxide LiOH is chemically transformed into $LiOH.H_2O$ that tends to be easily carbonated at a low temperature without eluting Li from the lithium nickelate composite oxide.

The coating compound Z according to the present invention is preferably produced by subjecting the core particle X constituted of the lithium nickelate composite oxide to humidification treatment and then to heat treatment in atmospheric air at a temperature of 150 to 450° C. The humidification treatment is preferably conducted under the conditions including a temperature of 10 to 50° C., a relative humidity of an atmospheric gas of 10 to 90%, and a treating time of 0.5 to 15 hr. In the case where the humidification treatment is conducted under severe conditions, i.e., when the temperature is higher than 50° C., the relative humidity of an atmospheric gas is more than 90% or the treating time is more than 15 hr, it is estimated that elution of Li from the core particle X constituted of the lithium nickelate composite oxide is initiated. The more preferred humidification treatment conditions include a temperature of 15 to 30° C., a relative humidity of an atmospheric gas of 15 to 80%, and a treating time of 1 to 10 hr. In addition, in order to promote the reaction for transforming the $LiOH.H_2O$ produced after the humidification treatment into $Li_2CO_3$, and prevent elution of lithium from the core particle X constituted of the lithium nickelate composite oxide, the temperature of the heat treatment to be conducted in atmospheric air is preferably in the range of 200 to 400° C.

From the results attained by subjecting the below-mentioned sample suspension to titration by a Warder method, it is estimated that the coating compound Z according to the present invention is constituted of LiOH or $Li_2CO_3$ remaining therein. More strict estimation is that the coating compound Z may be formed of $Li_2O$ or the other Li compound which can be converted into LiOH in the aforementioned suspension. Thus, the method for forming the coating compound Z is such a technology in which the core particle is subjected to the humidification treatment to convert the remaining LiOH-based impurity into $LiOH.H_2O$, and then subjected to low-temperature heat treatment in atmospheric air to convert the $LiOH.H_2O$ into $Li_2CO_3$, and therefore the resulting coating compound Z may be occasionally in the form of granules or films. Examples of particle surface analysis methods used for identifying the structure of the coating compound Z include observation using a high-resolution transmission electron microscope, observation using a high-resolution scanning electron microscope, elemental analysis in a depth direction by time-of-flight type secondary ion mass spectrometry, elemental analysis in a depth direction by X-ray photoelectron spectroscopy, etc.

The weight ratio of the coating compound Z to the coating compound Y, where the coating compounds are to be formed on the surface of the aforementioned core particle X, is usually 1 to 100, preferably 2 to 50 and more preferably 3 to 40. When the weight ratio of the coating compound Z to the coating compound Y lies within the aforementioned range, the resulting lithium nickelate-based positive electrode active substance particles can exhibit excellent repeated charge/discharge cycle characteristics when being highly charged, and generation of gases therefrom upon storage under high-temperature conditions can be suppressed.

Next, the non-aqueous electrolyte secondary battery using the lithium nickelate-based positive electrode active substance particles according to the present invention is described.

When producing a positive electrode sheet using the positive electrode active substance particles according to the present invention, a conducting agent and a binder are added to and mixed with the positive electrode active substance particles by an ordinary method. Examples of the preferred conducting agent include carbon black, graphite and the like. Examples of the preferred binder include polytetrafluoroethylene, polyvinylidene fluoride and the like. As a solvent for mixing these components, for example, N-methyl pyrrolidone is preferably used. The slurry comprising the positive electrode active substance particles, the conductive agent and the binder is kneaded until it becomes a honey-like liquid. The resulting positive electrode mixture slurry is applied onto a current collector at a coating speed of about 60 cm/sec using a doctor blade having a groove width of 25 to 500 μm, and then the resulting coating layer formed on the current collector is dried at a temperature of 80 to 180° C. for the purpose of removing the solvent therefrom and softening the binder. As the current collector, there may be used an Al foil having a thickness of about 20 μm. The current collector to which the positive electrode mixture has been applied is subjected to calendar roll treatment with a linear load of 0.1 to 3 t/cm, thereby obtaining the positive electrode sheet.

As a negative electrode active substance used in the battery, there may be used metallic lithium, lithium/aluminum alloys, lithium/tin alloys, graphite or the like. A negative electrode sheet is produced by the same doctor blade method as used upon production of the aforementioned positive electrode sheet, or metal rolling.

Also, as a solvent for preparation of the electrolyte solution, there may be used a combination of ethylene carbonate and diethyl carbonate, as well as an organic solvent comprising at least one compound selected from the group consisting of carbonates such as propylene carbonate and dimethyl carbonate, and ethers such as dimethoxyethane.

In addition, as the electrolyte solution, there may be used a solution prepared by dissolving lithium phosphate hexafluoride as well as at least one lithium salt selected from the group consisting of lithium perchlorate, lithium borate tetrafluoride and the like as an electrolyte in the aforementioned solvent.

The battery cell used for quantitative determination of gasses generated within the battery is preferably of a laminate type. The charge/discharge cycle of the battery is repeated several times to ascertain normal operation thereof as a secondary battery without any problems, and then, for example, the battery kept in a charged state is allowed to stand at 85° C. for 24 hr. The increased volume of the battery at room temperature is measured to calculate an increment of the volume of the secondary battery per unit weight of the positive electrode active substance, where the increment is derived from the high-temperature keeping test.

In the secondary battery having an Li counter electrode which is produced by using the positive electrode active substance particles according to the present invention, the initial discharge capacity thereof after being charged to 4.4 V is about 200 mAh/g as measured at 25° C., and the capacity retention rate thereof after repeating 100 charge/discharge cycles at a rate of 0.5C/1C is not less than 95% as measured at 25° C. In addition, the amount of gasses generated under the aforementioned conductions is not more than 1 cc per 1 g of the positive electrode active substance.

<Function>

The preferred lithium nickelate-based positive electrode active substance particles according to the present invention comprise the coating compound Y formed by a vapor phase epitaxy method and the coating compound Z comprising an Li element which is formed by humidification treatment followed by heat treatment. For this reason, the content of lithium hydroxide that remains in the positive electrode active substance particles is extremely low, and it is also possible to prevent direct contact between a non-aqueous electrolyte solution and the positive electrode active substance particles. In addition, it is expected that the coating compound Z that simultaneously remains in an adequate amount acts for suppressing occurrence of decomposition reaction of the electrolyte solution comprising Li. Therefore, the electrode slurry can be prepared without gelation thereof. Moreover, since the resulting secondary battery can be prevented from suffering from occurrence of side reactions other than electrode reactions associated with charge/discharge operations thereof, the lithium nickelate-based positive electrode active substance particles according to the present invention can be suitably used as positive electrode active substance particles for the secondary battery that is excellent in repeated charge/discharge cycle characteristics at a high voltage and can be prevented from suffering from volume expansion owing to generation of gases upon storage under high-temperature conditions.

EXAMPLES

Specific examples of the present invention are described below.

Example 1

Cobalt-containing nickel hydroxide $Ni_{0.84}Co_{0.16}(OH)_2$ as a precursor was obtained by a crystallization method via an ammonia complex in a water solvent over several days. The cobalt-containing nickel hydroxide, lithium hydroxide monohydrate $LiOH.H_2O$ and aluminum hydroxide $Al(OH)_3$ were weighed in predetermined amounts such as the molar ratio between elements Li, Ni, Co and Al therein was Li:Ni:Co:Al=1.02:0.81:0.15:0.04. Thereafter, these compounds were mixed each other using a high-speed mixer, and the resulting mixture was calcined in an oxygen atmosphere at 770° C. using a roller hearth kiln, thereby obtaining a lithium nickelate composite oxide capable of forming a core particle X.

Thirty grams of the thus obtained lithium nickelate composite oxide particles were allowed to stand for 6 hr while flowing atmospheric air having a temperature of 20° C. and a relative humidity of 21% at a rate of 80 ft/min therethrough to transform LiOH included in the particles into $LiOH.H_2O$. Subsequently, the impurity was converted into $Li_2CO_3$ in atmospheric air at 350° C. for 2 hr, thereby forming the coating compound Z.

In order to form a coating compound Y, the lithium nickelate composite oxide provided thereon with the aforementioned coating compound Z was treated by an atomic layer deposition method. In the atomic layer deposition method, trimethyl aluminum $Al_2(CH_3)_6$ was used as a raw material gas A, and $H_2O$ was used as a raw material gas B. These raw materials were subjected to 4 cycle treatment at 180° C., thereby obtaining lithium nickelate-based positive electrode active substance particles according to the present invention.

The powder characteristics of the thus obtained lithium nickelate-based positive electrode active substance particles according to the present invention were evaluated as follows.

The surface and shape of the sample were observed using a field emission type scanning electron microscope (FE-SEM) "S-4800" manufactured by Hitachi High-Technologies Corporation. The surface and shape of lithium carbonate particles were estimated by the observation with a high magnification.

The sample was dried and deaerated at 250° C. for 60 min in a nitrogen gas atmosphere, and the BET specific surface area of the thus treated sample was measured using a device "Monosorb" manufactured by Quantachrome Instruments.

In order to identify a crystal phase of the sample and calculate crystal structure parameters thereof, the sample was measured using a powder X-ray diffraction apparatus "SmartLab 3 kW" manufactured by Rigaku Co., Ltd. The X-ray pattern of the sample was measured through a monochromater under conditions of Cu-Kα, 40 kV and 44 mA, and the measurement was conducted by step scanning method at a rate of 3 deg./min at the intervals of 0.02° in the range of 2θ (deg.) of 15 to 120 (15≤2θ (deg.)≤120).

The $D_{50}$ value as a volume-based median diameter of aggregated particle of the sample was measured using a laser diffraction scattering type particle size distribution meter "SALD-2201" manufactured by Shimadzu Corporation.

The amounts of LiOH and $Li_2CO_3$ in the sample were determined by using a Warder method based on calculation from a hydrochloric acid titration curve of a solution prepared by suspending the sample in a water solvent at room temperature. In the method, 10 g of the sample was suspended in 50 cc of water using a magnetic stirrer for 1 hr.

The 2% pH value of the sample was measured as follows. That is, 2 g of the sample was suspended in 100 cc of pure water at room temperature, and the pH value of the resulting suspension was measured using a pH meter at room temperature.

The contents of lithium and nickel as main component elements as well as cobalt and aluminum as subsidiary component elements were determined as follows. That is, the sample particles were completely dissolved in hydrochloric acid, and the resulting solution was measured using an ICP emission spectroscopic apparatus (ICP-OES) "ICPS-7510" manufactured by Shimadzu Corporation by a calibration curve method.

The surface composition analysis of the sample was conducted using an X-ray photoelectron spectroscopy (XPS) apparatus "DLD Axis Ultra XPS" manufactured by Kratos Analytical Ltd. The measurement was conducted under such a condition that using a monochromatic X ray (Al Kα) as an X-ray source, the sample was analyzed in a depth direction from a surface thereof by Ar etching at an anode voltage of 14 kV and an emission current of 8 mA, thereby preparing a profile of the sample in a depth direction in terms of a $Ta_2O_5$ substrate.

It was estimated from the raw material gas species used that the coating compound produced by ALD method was $Al_2O_3$. The quantitative determination of the coating compound was conducted as follows. That is, 5 g of the sample was dispersed in 100 cc of pure water, and the resulting dispersion was boiled and cooled, and then the coating compound was quantitatively determined by calculation from the amount of Al dissolved therein.

The CR2032 type coin cells manufactured by the following production method using the thus obtained positive electrode active substance particles were characterized as a secondary battery.

The positive electrode active substance, acetylene black and graphite both serving as a conducting agent, and polyvinylidene fluoride as a binder were accurately weighed such that the weight ratio between these components was 90:3:3:4, and dispersed in N-methyl pyrrolidone, and the resulting dispersion was fully mixed using a high-speed kneading machine to prepare a positive electrode mixture slurry. Next, the positive electrode mixture slurry was applied onto an Al foil as a current collector using a doctor blade "PI-1210 film coater" manufactured by Tester Sangyo Co., Ltd., and then dried at 120° C., and the resulting sheet was pressed under a pressure of 0.5 t/cm, thereby obtaining a positive electrode sheet comprising the positive electrode active substance particles in an amount of 9 mg per 1 $cm^2$ of the positive electrode sheet. The thus obtained positive electrode sheet was punched into 16 mmφ, and the resulting sheet was used as a positive electrode.

A metallic lithium foil was punched into 16 mmφ and used as a negative electrode.

"CELGARD #2400" produced by Celgard, LLC., was punched into a size of 20 mmφ, and used as a separator. Moreover, 1 mol/L $LiPF_6$ solution of a mixed solvent comprising ethylene carbonate and diethyl carbonate at a volume ratio of 1:1 was used as an electrolyte solution. These members were assembled to thereby produce a coin cell of a CR2032 type.

In order to prevent decomposition of the electrolyte solution or the metallic lithium by atmospheric air, the assembling of the battery was conducted in a glove box held in an argon atmosphere having a well-controlled dew point.

The initial discharge capacity of the battery at 25° C. was measured by testing the battery using a charge/discharge tester "TOSCAT-3000" manufactured by Toyo System Co., Ltd., under such a condition that at a constant current of 0.1C, the lower limit of a discharge voltage thereof was set to 3.0 V, and the upper limit of a charge voltage thereof was set to 4.4 V. In addition, the battery was also subjected to 100 charge/discharge cycle test at 25° C. under such a condition that at a constant current of 0.5C/1C, the lower limit of a discharge voltage thereof was set to 3.0 V, and the upper limit of a charge voltage thereof was set to 4.4 V.

In order to quantitatively determine the amount of gases generated in the battery, graphite as a negative electrode, $LiPF_6$ as an electrolyte (concentration: 1 mol/L), and ethylene carbonate and diethyl carbonate (volume ratio=1:1) as a mixed solvent for an electrolyte solution were used to produce a laminate type battery (size: 105 mm×55 mm). By setting the lower-limit voltage to 3.0 and the upper-limit voltage to 4.2 V, the initial charge/discharge cycle was conducted under a charge rate of 0.05C and a discharge rate of 0.1C, the second charge/discharge cycle was conducted at a charge rate of 0.2C and a discharge rate of 0.5C, and the third cycle was conducted at a charge rate of 0.1C. At the time of reaching a charged state in the third cycle, the current flow through the battery was stopped, and the battery was allowed to stand at 85° C. for 24 hr. Thereafter, the increased volume of the battery was measured at room temperature by the Archimedes method to calculate an increment of the volume of the secondary batter per 1 g of the positive electrode active substance.

From ICP composition analysis and XRD phase analysis, it was confirmed that the lithium nickelate composite oxide capable of forming the aforementioned core particle X was constituted of $Li_{1.02}Ni_{0.51}Co_{0.15}Al_{0.04}O_2$ having a layer structure.

Figure 6:
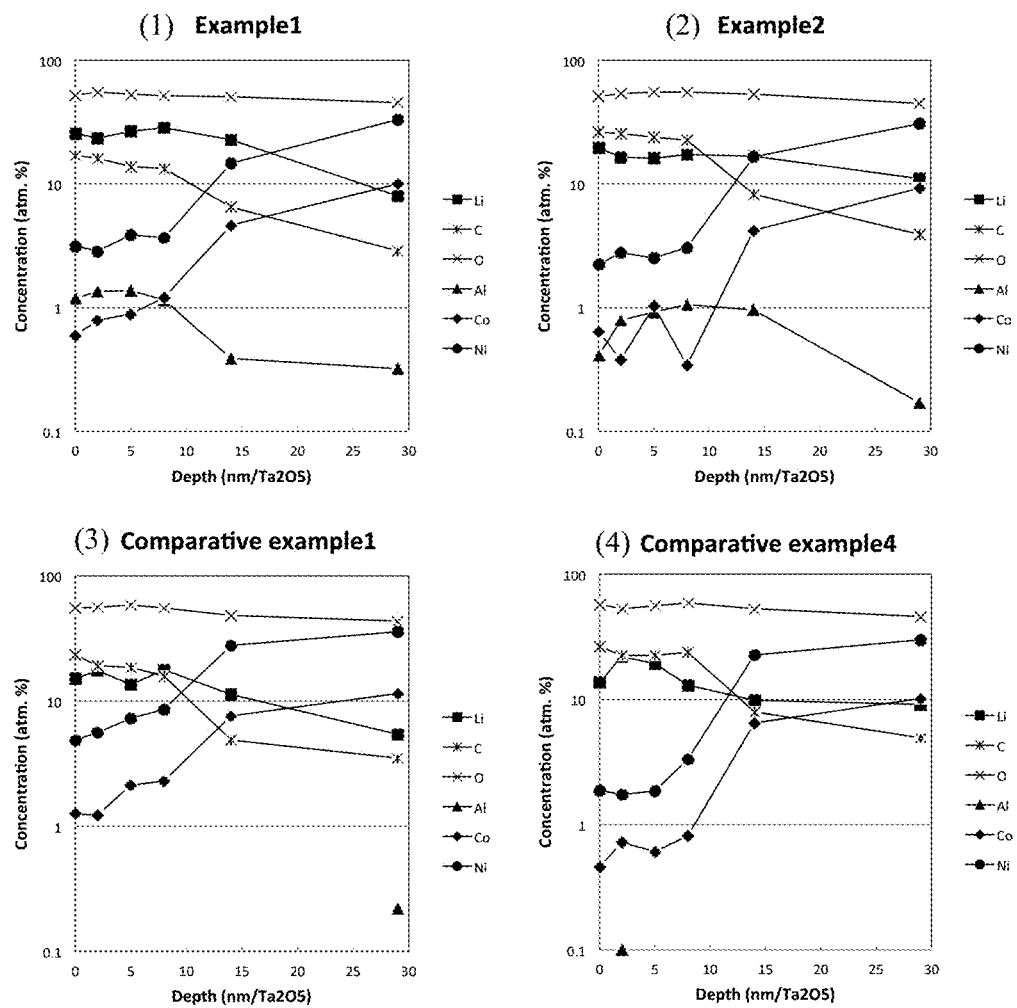
FIG. 6 shows graphs showing etching depth profiles of elemental contents (lithium Li, carbon C, oxygen O, aluminum Al, cobalt Co and nickel Ni), determined by X-ray photoelectron spectroscopy of the positive electrode active substance particles obtained in (1) Example 1 and (2) Example 2 according to the present invention, as well as the positive electrode active substance particles obtained in (3) Comparative Example 1 and (4) Comparative Example 3.

In addition, as shown in FIG. 6(1) showing a profile in a depth direction of XPS of the aforementioned lithium nickelate-based positive electrode active substance particles, large amounts of elements Li, Al and C were detected in a surface layer of the respective particles, and therefore it was estimated that the coating compound Y and the coating compound Z were formed thereon, and that the coating compound Y was constituted of $Al_2O_3$ whereas the coating compound Z was constituted of LiOH and $Li_2CO_3$. The Al concentration is the highest at the outermost surface and starts to decrease at the depth of 10 $nm/Ta_2O_5$. On the other hand, the Li concentration increases from the outermost surface to inside and reaches highest at the depth of 10 nm/$Ta_2O_5$. This indicates that the outermost surface is enriched in compound Y while the surface below that is enriched in compound Z. Such layer by layer protection provides lithium nickelate-based positive electrode active substance particles having an excellent performance in charge/discharge cycle characteristics when highly charged, and hardly suffer from generation of gases upon storage under high-temperature conditions. It was also confirmed that the lattice constants in XRD as expressed by a hexagonal lattice were a=2.8651 Å and c=14.185 Å.

The powder characteristics of the lithium nickelate-based positive electrode active substance particles obtained in the respective Examples and Comparative Examples as well as battery characteristics thereof are shown in Tables 1, 2 and 4. The contents of lithium hydroxide and lithium carbonate were both low, and the ratio therebetween was not less than 1. The initial capacity of the battery at a 4.4 V high charge voltage was about 200 mAh, and the capacity retention rate of 100 cycle characteristics of the battery at the same charge voltage was not less than 95%. It was also estimated that the increased volume of the battery as measured in gas generation test upon storage at 85° C. was only 0.33 cc/g, and therefore the battery exhibited high-performance secondary battery characteristics.

Example 2

Using the lithium nickelate composite oxide $Li_{1.02}Ni_{0.81}Co_{0.15}Al_{0.04}O_2$ having a layer structure capable of forming the core particle X which were obtained in Example 1, a coating compound Y was formed by atomic layer deposition method. The treating conditions used in the atomic layer deposition method were the same as those used in Example 1, i.e., trimethyl aluminum $Al_2(CH_3)_6$ was used as the raw material gas A, and $H_2O$ was used as the raw material gas B, and these raw materials were subjected to 4 cycle treatment at 180° C. Thereafter, while flowing air having a temperature of 20° C. and a relative humidity of 21% at a rate of 80 ft/min, the resulting material was subjected to humidification treatment for 6 hr, and then treated in atmospheric air at 350° C. for 2 hr, thereby producing the coating compound Z.

Figure 2:
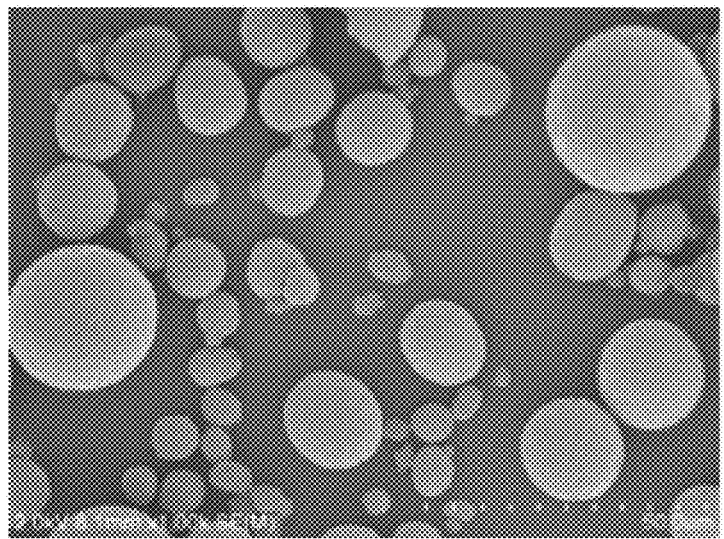
FIG. 2 is an SEM micrograph with a low magnification (×1,000) showing lithium nickelate-based positive electrode active substance particles obtained in Example 2.
Figure 3:
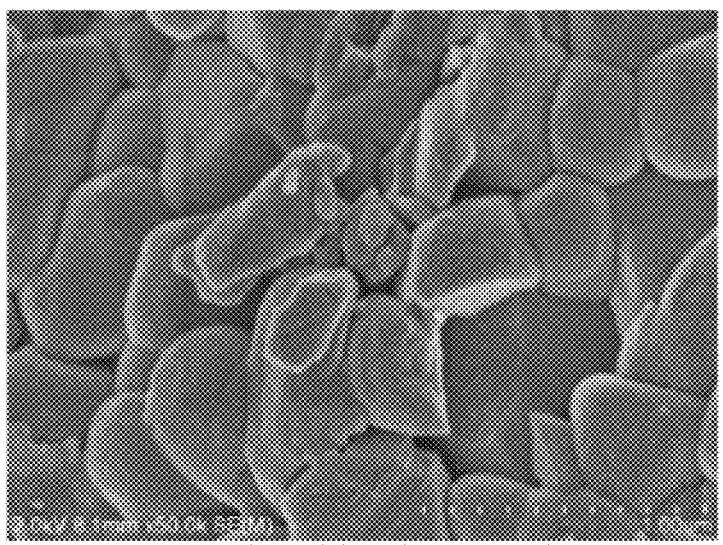
FIG. 3 is an SEM micrograph with a high magnification (×50,000) showing lithium nickelate-based positive electrode active substance particles obtained in Example 2.

As shown in FIG. 6(2) showing a profile in a depth direction of XPS of the resulting lithium nickelate-based positive electrode active substance particles, large amounts of elements Li, Al and C were detected in a surface layer of the respective particles, and the coating compound Y that was estimated to comprise $Al_2O_3$ and the coating compound Z that was estimated to comprise LiOH and $Li_2CO_3$ were formed thereon. The Li concentration is the highest at the outermost surface and starts to decrease at the depth of 10 nm/$Ta_2O_5$. On the other hand, the Al concentration increases from the outermost surface to inside and reaches highest at the depth of 10 nm/$Ta_2O_5$. This indicates that the outermost surface is enriched in compound Z while the surface below that is enriched in compound Y. It was also confirmed that the lattice constants in XRD as expressed by a hexagonal lattice were a=2.8653 Å and c=14.177 Å. As shown by the powder characteristics and battery characteristics, the resulting battery exhibited the same high-performance secondary battery characteristics as in Example 1. As shown by the SEM micrograph in FIG. 2, the active substance particles were formed into aggregated particles, and the average particle diameter of the aggregated particles as observed was the value close to $D_{50}$=15.8 μm. In addition, as shown by the SEM micrograph in FIG. 3, the active substance particles were constituted of submicron primary particles, and irregularities were observed on the surface layer owing to the coating compound Y or the coating compound Z formed thereon.

Comparative Example 1

Figure 4:
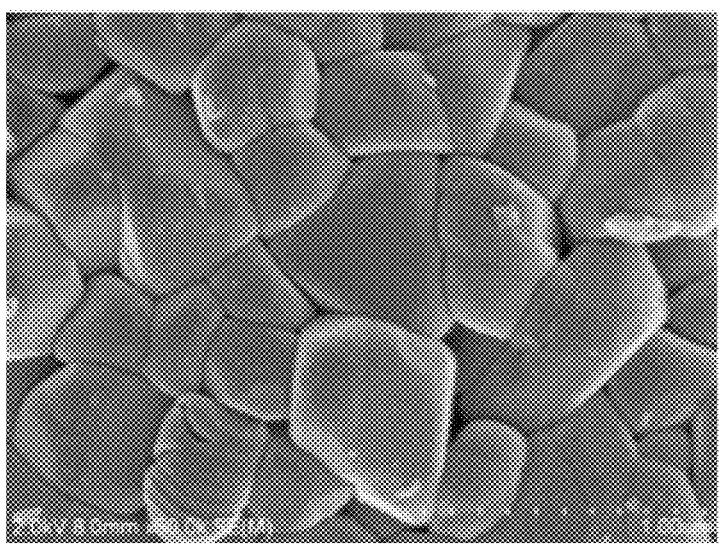
FIG. 4 is an SEM micrograph with a high magnification (×50,000) showing positive electrode active substance particles used in Comparative Example 1, where the particles constitute a lithium nickelate composite oxide capable of forming a core particle obtained in Example 1.

The lithium nickelate composite oxide $Li_{1.02}Ni_{0.81}Co_{0.15}Al_{0.04}O_2$ having a layer structure capable of forming the core particle X which were obtained in Example 1 were used as positive electrode active substance particles without being subjected to any surface treatment. As shown in FIG. 6(3) showing a profile in a depth direction of XPS of the positive electrode active substance particles, large amounts of elements Li and C were detected in a surface layer of the respective particles, and no element Al can be detected. Therefore it was estimated that LiOH and $Li_2CO_3$ were present thereon. However, as shown by the SEM micrograph in FIG. 4, the surface of the respective particles was smooth, and the particles having a size of not more than 100 nm were observed merely here and there. In consequence, the resulting particles failed to sufficiently provide the coating compound thereon. It was also confirmed that the lattice constants in XRD as expressed by a hexagonal lattice were a=2.8651 Å and c=14.181 Å.

The powder characteristics of the resulting particles as positive electrode active substance particles and the battery characteristics thereof are shown in Tables. The resulting particles had a high lithium hydroxide content, and the ratio of the content of lithium carbonate to the content of lithium hydroxide was less than 1, and therefore the abundance ratio of lithium hydroxide in the particles was high. The initial capacity of the resulting battery at a 4.4 V high charge voltage was about 200 mAh, but the capacity retention rate of 100 cycle characteristics of the battery at the same charge voltage was as low as 86%. The increased volume of the battery as measured in gas generation test upon storage at 85° C. was also as high as 1.06 cc/g, and therefore the battery exhibited poor-performance secondary battery characteristics.

Comparative Example 2

The sample withdrawn in the course of the production process in Example 2, i.e., the sample obtained after the treatment by atomic layer deposition method was used a positive electrode active substance. As recognized from the powder characteristics and battery characteristics shown in Tables, the positive electrode active substance had a high lithium hydroxide content as well as a high 2% powder pH value, and therefore the resulting battery exhibited poor-performance secondary battery characteristics.

Comparative Example 3

Figure 5:
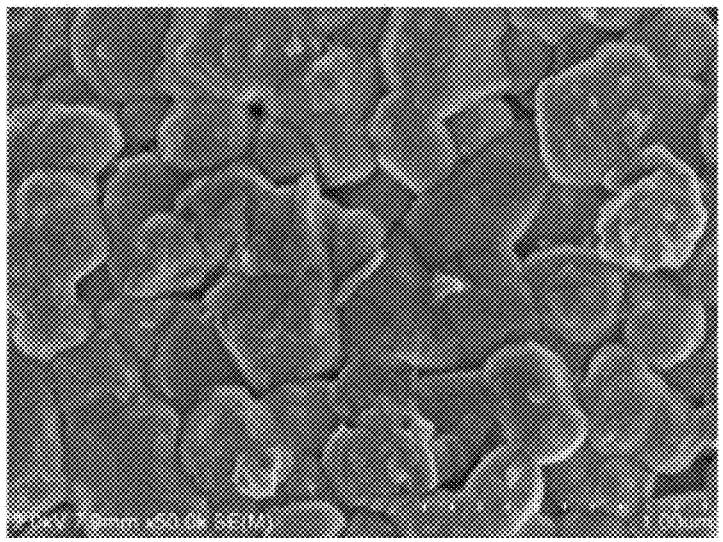
FIG. 5 is an SEM micrograph with a high magnification (×50,000) showing positive electrode active substance particles used in Comparative Example 3.

The sample withdrawn in the course of the production process in Example 1, i.e., the sample obtained immediately after completion of the humidification treatment and the heat treatment in atmospheric air was used a positive electrode active substance. As recognized from the powder characteristics and battery characteristics shown in Tables, the positive electrode active substance had a high lithium carbonate content, and therefore the resulting battery exhibited poor-performance secondary battery characteristics. As shown by the SEM micrograph in FIG. 5, the surface of the respective particles was not smooth, and the particles having a size of not more than 100 nm were observed over the whole surface of the respective particles. In consequence, the resulting particles were provided thereon with the coating compound Z that was estimated to comprise lithium carbonate.

Comparative Example 4

The lithium nickelate composite oxide $Li_{1.02}Ni_{0.81}Co_{0.15}Al_{0.04}O_2$ having a layer structure capable of forming the core particle X which were obtained in Example 1 were treated with a flowing mixed gas comprising 50 vol % of $CO_2$ and 50 vol % of atmospheric air at 250° C. for 2 hr. As recognized from the powder characteristics and battery characteristics shown in Tables, the obtained particles had a high lithium hydroxide content, and therefore the resulting battery exhibited poor-performance secondary battery characteristics. As shown in FIG. 6(4) showing a profile in a depth direction of XPS of the resulting positive electrode active substance particles, large amounts of elements Li and C were detected in a surface layer of the respective particles, and no element Al was detected. Therefore it was estimated that $Li_2CO_3$ were present therein.

Example 3

Cobalt-containing nickel hydroxide $Ni_{0.84}Co_{0.16}(OH)_2$ as a precursor was obtained by a crystallization method via an ammonia complex in a water solvent over several days. The subsequent procedures were conducted in the same manner as in Example 1 to obtain $Li_{1.02}Ni_{0.81}Co_{0.15}Al_{0.04}O_2$ core particle. A coating compound Y was formed by atomic layer deposition method. The atomic layer deposition method was conducted in the same manner as in Example 1. Thereafter, while flowing air having a temperature of 20° C. and a relative humidity of 21% at a rate of 80 ft/min, the resulting material was subjected to humidification treatment for 6 hr and then treated in atmospheric air at 350° C. for 2 hr, thereby producing the coating compound Z. The powder characteristics of the lithium nickelate-based positive electrode active substance particles obtained in Examples 3 to 7 and Comparative Examples 5 to 14 as well as battery characteristics thereof are shown in Table 2, 3, and 4.

Example 4

Using the lithium nickelate composite oxide $Li_{1.02}Ni_{0.51}Co_{0.15}Al_{0.04}O_2$ having a layer structure capable of forming the core particle X which were obtained in Example 1, a coating compound Y was formed by atomic layer deposition method. The atomic layer deposition method was conducted in the same manner as in Example 1 except that the number of cycles in the treatment conditions of the method was changed to 2, i.e., in the method, trimethyl aluminum $Al_2(CH_3)_6$ was used as the raw material gas A, and $H_2O$ was used as the raw material gas B, and these raw materials were subjected to the treatment at 180° C. Thereafter, while flowing air having a temperature of 20° C. and a relative humidity of 21% at a rate of 80 ft/min, the resulting material was subjected to humidification treatment for 6 hr and then treated in atmospheric air at 350° C. for 2 hr, thereby producing the coating compound Z.

Example 5

The same procedure as in Example 4 was conducted except that the number of cycles in the atomic layer deposition method was changed from 2 to 3.5.

Example 6

The same procedure as in Example 5 was conducted except that the humidification treatment conducted for 6 hr while flowing air having a temperature of 20° C. and a relative humidity of 21% at a rate of 80 ft/min was replaced with the treatment in which a mixed gas comprising air and $CO_2$ at a volume ratio of air:$CO_2$=1:1 was flowed at 20° C. at a rate of 8 L/min (relative humidity: about 20%) for 2 hr.

Example 7

The same procedure as in Example 4 was conducted except that the number of cycles in the atomic layer deposition method was changed from 2 to 7.

Comparative Example 5

The lithium nickelate composite oxide capable of forming the core particle X by the treatment in an oxygen atmosphere at 770° C. using a roller hearth kiln which was obtained in the course of Example 3 was directly used as a positive electrode active substance.

Comparative Example 6

The same procedure as in Example 3 was conducted except that the step of producing the coating compound Z by humidification followed with being treated in atmospheric air at 350° C. for 2 hr was omitted.

Comparative Example 7

The lithium nickelate composite oxide capable of forming the core particle X which was used in Example 3 was treated in a mixed gas comprising air and $CO_2$ at a volume ratio of air:$CO_2$=3:1 at 350° C. for 2 hr. However, no treatment by the atomic layer deposition method was conducted.

Comparative Example 8

The lithium nickelate composite oxide capable of forming the core particle X which was used in Example 1 was treated in a mixed gas comprising air and $CO_2$ at a volume ratio of air:$CO_2$=3:1 at 350° C. for 2 hr. However, no treatment by the atomic layer deposition method was conducted.

Comparative Example 9

The coating compound Y was formed on the lithium nickelate composite oxide capable of forming the core particle X which was obtained during the step in the course of Example 4, and the resulting particles were used as a positive electrode active substance.

Comparative Example 10

The coating compound Y was formed on the lithium nickelate composite oxide capable of forming the core particle X which was obtained during the step in the course of Example 5, and the resulting particles were used as a positive electrode active substance.

Comparative Example 11

The coating compound Y was formed on the lithium nickelate composite oxide capable of forming the core particle X which was obtained during the step in the course of Example 7, and the resulting particles were used as a positive electrode active substance.

Comparative Example 12

Thirty grams of the lithium nickelate composite oxide particles capable of forming the core particle X which was obtained during the step in the course of Example 3 were allowed to stand for 6 hr while flowing atmospheric air having a temperature of 20° C. and a relative humidity of 21% at a rate of 80 ft/min therethrough to transform LiOH included in the particles into LiOH.H$_2$O. Subsequently, the impurity was converted into Li$_2$CO$_3$ in atmospheric air at 350° C. for 2 hr, thereby forming the coating compound Z. However, the step of forming the coating compound Y was omitted.

Comparative Example 13

The same procedure as in Comparative Example 12 was conducted except that the step of allowing the lithium nickelate composite oxide particles to stand for 6 hr while flowing atmospheric air having a temperature of 20° C. and a relative humidity of 21% at a rate of 80 ft/min therethrough was replaced with the step of allowing the lithium nickelate composite oxide particles to stand for 2 hr while flowing a mixed gas comprising air and CO$_2$ at a volume ratio of air:CO$_2$=1:1 at a rate of 8 L/min.

Comparative Example 14

Thirty grams of the lithium nickelate composite oxide particles capable of forming the core particle X which was obtained during the step in the course of Example 4 were allowed to stand for 2 hr while flowing a mixed gas comprising air and CO$_2$ at a volume ratio of air:CO$_2$=1:1 at 20° C. at a rate of 8 L/min therethrough to transform LiOH included in the particles into LiOH.H$_2$O. Subsequently, the impurity was converted into Li$_2$CO$_3$ in atmospheric air at 350° C. for 2 hr, thereby forming the coating compound Z. However, the step of forming the coating compound Y was omitted.

TABLE 1

| Example | Covering compound Z LiOH (wt %) | Covering compound Z Li$_2$CO$_3$ (wt %) | Li$_2$CO$_3$/LiOH (weight ratio) | Covering compound Y Al$_2$O$_3$ (wt %) | (Li$_2$CO$_3$ + LiOH)/Al$_2$O$_3$ (weight ratio) | BET surface area (m$^2$/g) | D$_{50}$ (μm) | pH @2 wt % slurry (—) |
|---|---|---|---|---|---|---|---|---|
| Example1 | 0.29 | 0.55 | 1.90 | 0.023 | 37 | 0.16 | 15.3 | 11.26 |
| Example2 | 0.36 | 0.48 | 1.36 | 0.023 | 37 | 0.16 | 15.8 | 11.24 |
| Comparative example1 | 0.56 | 0.42 | 0.75 | 0.00 | — | 0.22 | 15.2 | 11.40 |
| Comparative example2 | 0.54 | 0.38 | 0.70 | 0.021 | 44 | 0.16 | 15.5 | 11.49 |
| Comparative example3 | 0.23 | 0.61 | 2.65 | 0.00 | — | 0.14 | 15.9 | 11.03 |
| Comparative example4 | 0.41 | 0.54 | 1.32 | 0.00 | — | 0.13 | 15.1 | 11.28 |

TABLE 2

| Example | Covering compound Z LiOH (wt %) | Covering compound Z Li$_2$CO$_3$ (wt %) | Li$_2$CO$_3$/LiOH (weight ratio) | Covering compound Y Al$_2$O$_3$ (existence) | BET surface area (m$^2$/g) | D$_{50}$ (μm) | pH @2 wt % slurry (—) |
|---|---|---|---|---|---|---|---|
| Example 3 | 0.20 | 0.63 | 3.15 | yes | 0.49 | 5.9 | 10.71 |
| Example 4 | 0.34 | 0.55 | 1.62 | yes | 0.14 | 16.3 | 11.19 |
| Example 5 | 0.19 | 0.65 | 3.42 | yes | 0.15 | 15.3 | 11.21 |
| Example 6 | 0.36 | 0.48 | 1.33 | yes | 0.18 | 15.4 | 11.23 |
| Example 7 | 0.26 | 0.61 | 2.35 | yes | 0.18 | 15.4 | 11.17 |
| Comparative example 5 | 0.68 | 0.37 | 0.54 | No | 0.42 | 5.7 | 11.70 |
| Comparative example 6 | 0.57 | 0.42 | 0.74 | yes | 0.36 | 5.7 | 11.46 |
| Comparative example 7 | 0.21 | 1.17 | 5.57 | No | 0.62 | 5.5 | 10.97 |
| Comparative example 8 | 0.31 | 0.74 | 2.39 | No | 0.14 | 15.1 | 11.31 |
| Comparative example 9 | 0.55 | 0.38 | 0.69 | yes | 0.15 | 15.2 | 11.49 |
| Comparative example 10 | 0.55 | 0.37 | 0.67 | yes | 0.27 | 15.4 | 11.39 |
| Comparative example 11 | 0.54 | 0.39 | 0.72 | yes | 0.16 | 14.1 | 11.51 |
| Comparative example 12 | 0.23 | 0.64 | 2.78 | No | 0.41 | 5.8 | 11.13 |
| Comparative example 13 | 0.25 | 0.72 | 2.88 | No | 0.40 | 6.1 | 11.11 |
| Comparative example 14 | 0.46 | 0.50 | 1.09 | No | 0.18 | 15.1 | 11.38 |

TABLE 3

| Example | Capacity @3.0-4.4 V, 0.1 C (mAh/g) | Retention@ 100 cycle, 3.0-4.4 V, 1 C (%) |
|---|---|---|
| Example 1 | 197 | 95 |
| Example 2 | 198 | 100 |
| Example 3 | 202 | 91 |
| Example 4 | 199 | 92 |
| Example 5 | 202 | 95 |
| Example 6 | 200 | 95 |
| Example 7 | 200 | 93 |
| Comparative example 1 | 201 | 86 |
| Comparative example 2 | 206 | 90 |
| Comparative example 3 | 200 | 93 |
| Comparative example 4 | 201 | 91 |
| Comparative example 5 | 199 | 89 |
| Comparative example 6 | 202 | 89 |
| Comparative example 10 | 201 | 89 |
| Comparative example 12 | 201 | 93 |
| Comparative example 13 | 197 | 91 |

TABLE 4

| Example | Gassing @85° C.- 24 h (cc/g) |
|---|---|
| Example 1 | 0.33 |
| Example 2 | 0.59 |
| Example 3 | 0.79 |
| Comparative example 1 | 1.06 |
| Comparative example 2 | 2.00 |
| Comparative example 3 | 1.25 |
| Comparative example 4 | 1.46 |
| Comparative example 5 | 1.62 |
| Comparative example 6 | 1.14 |
| Comparative example 7 | 1.59 |
| Comparative example 10 | 1.54 |
| Comparative example 11 | 1.93 |
| Comparative example 13 | 1.11 |

It was confirmed that the secondary battery characteristics obtained by the lithium nickelate-based positive electrode active substance particles according to the present invention were high-performance characteristics from the standpoint of improving repeated charge/discharge cycle characteristics at a high voltage as well as avoiding generation of gases upon storage under high-temperature conditions.

INDUSTRIAL APPLICABILITY

In accordance with the present invention, by forming two different kinds of surface coating compounds on core particles, there are provided lithium nickelate-based positive electrode active substance particles which are excellent in repeated charge/discharge cycle characteristics upon being highly charged and can be inhibited from suffering from generation of gases upon storage under high-temperature conditions and a process for producing the lithium nickelate-based positive electrode active substance particles, as well as a non-aqueous electrolyte secondary battery. The lithium nickelate-based positive electrode active substance particles have extremely low contents of lithium hydroxide and lithium carbonate as impurities, so that the resulting secondary battery has a long service life and a high energy density.

The invention claimed is:

1. Positive electrode active substance particles each comprising:
   a core particle X comprising a lithium nickelate composite oxide having a layer structure which is represented by the formula:

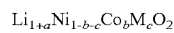
   $$Li_{1+a}Ni_{1-b-c}Co_bM_cO_2$$

wherein M is at least one element selected from the group consisting of Mn, Al, B, Mg, Ti, Sn, Zn and Zr; and wherein:
   $-0.1 \leq a \leq 0.2$;
   $0.05 \leq b \leq 0.5$; and
   $0.01 \leq c \leq 0.4$;
   a coating compound Y comprising at least one element selected from the group consisting of Al, Mg, Zr, Ti and Si, wherein compound Y comprises an oxide, carbonate, or hydroxide; and
   a coating compound Z comprising an Li element, wherein coating compound Z comprises an oxide, carbonate, or hydroxide,
   in which a content of lithium hydroxide (LiOH) in the coating compound Z is 0 to 0.40% by weight, a content of lithium carbonate ($Li_2CO_3$) in the coating compound Z is 0 to 0.65% by weight, and a weight ratio of the content of lithium carbonate to the content of lithium hydroxide in the coating compound Z is not less than 1 and not greater than 3.42,
   wherein coating compound Y and coating compound Z are separate coating compounds.

2. The positive electrode active substance particles according to claim 1, wherein a weight ratio of the coating compound Z to the coating compound Y is in the range of 1 to 100.

3. The positive electrode active substance particles according to claim 1, wherein the positive electrode active substance particles have a BET specific surface area of 0.05 to 0.70 m²/g, a median diameter $D_{50}$ of aggregated particles of 1 to 30 μm, and a 2% powder pH value of not more than 11.40.

4. A non-aqueous electrolyte secondary battery comprising a positive electrode active substance comprising the positive electrode active substance particles as claimed in claim 1.

5. A process for producing the positive electrode active substance particles as claimed in claim 1, comprising the steps of:
   forming the coating compound Y on a surface of the core particle X by a vapor phase epitaxy method; and then
   subjecting the resulting particle to humidification treatment and heat treatment in atmospheric air at a temperature of 150 to 450° C. to form the coating compound Z on the particle.

6. A process for producing the positive electrode active substance particles as claimed in claim 1, comprising the steps of:
  subjecting the core particle X to humidification treatment and heat treatment in atmospheric air at a temperature of 150 to 450° C. to form the coating compound Z on a surface of the core particle X; and then
  forming the coating compound Y on the resulting particle by a vapor phase epitaxy method.

* * * * *